(12) United States Patent
Negley et al.

(10) Patent No.: US 8,598,809 B2
(45) Date of Patent: Dec. 3, 2013

(54) WHITE LIGHT COLOR CHANGING SOLID STATE LIGHTING AND METHODS

(75) Inventors: Gerald H. Negley, Durham, NC (US); Antony Paul Van De Ven, Sai Kung (HK)

(73) Assignee: Cree, Inc., Durham, NC (US)

( * ) Notice: Subject to any disclaimer, the term of this patent is extended or adjusted under 35 U.S.C. 154(b) by 613 days.

(21) Appl. No.: 12/544,131

(22) Filed: Aug. 19, 2009

(65) Prior Publication Data

US 2011/0043137 A1 Feb. 24, 2011

(51) Int. Cl.
*H05B 37/02* (2006.01)

(52) U.S. Cl.
USPC .................. 315/297; 315/185 R; 315/313

(58) Field of Classification Search
USPC ............. 315/185 R, 186, 192, 312, 313, 314, 315/291, 295, 294, 297
See application file for complete search history.

(56) References Cited

U.S. PATENT DOCUMENTS

| | | | |
|---|---|---|---|
| 3,760,237 A | 9/1973 | Jaffe | ............................. 257/98 |
| 4,307,297 A | 12/1981 | Groff | |
| 4,511,425 A | 4/1985 | Boyd | ............................. 156/493 |
| 4,946,547 A | 8/1990 | Palmour et al. | ............... 156/643 |
| 5,040,868 A | 8/1991 | Waitl | |
| 5,130,761 A | 7/1992 | Tanaka | ............................. 357/17 |
| 5,167,556 A | 12/1992 | Stein | |
| 5,200,022 A | 4/1993 | Kong et al. | .................... 156/612 |
| RE34,861 E | 2/1995 | Davis et al. | .................... 437/100 |
| 5,453,405 A | 9/1995 | Fan et al. | ......................... 438/34 |
| 5,643,834 A | 7/1997 | Harada et al. | ................. 438/122 |
| 5,703,401 A | 12/1997 | Van De Water | |
| 5,706,177 A | 1/1998 | Nather | |
| 5,790,298 A | 8/1998 | Tonar | ............................. 359/267 |
| 5,813,753 A | 9/1998 | Vriens et al. | ................... 362/293 |
| 5,907,151 A | 5/1999 | Gramann | |
| 5,959,316 A | 9/1999 | Lowery | ............................ 257/98 |

(Continued)

FOREIGN PATENT DOCUMENTS

| | | |
|---|---|---|
| CN | 1470072 | 1/2004 |
| CN | 1470072 A | 1/2004 |

(Continued)

OTHER PUBLICATIONS

International Search Report and Written Opinion in counterpart PCT Application No. PCT/US2010/002211 mailed Nov. 19, 2010.

(Continued)

*Primary Examiner* — Don Le
(74) *Attorney, Agent, or Firm* — Koppel, Patrick, Heybl & Philpott

(57) ABSTRACT

Solid state lighting (SSL) luminaries are disclosed wherein the emission intensity of discrete light sources within the SSL luminaire can be varied to produce luminaire light having different characteristics. The present invention can utilize the unique circuit topology of SSL luminaires to vary the emission intensity of different types of LEDs in the luminaire. In some embodiments, the different types of LEDs are connected in respective serial strings, and the intensity of emission of the LEDs in each of the strings can be varied by changing the electrical signal driving the strings. In some of these embodiments, white light is emitted from the SSL luminaire by combining emission from BSY and red LEDs. For these embodiments the color changing solutions according to the present invention can include, as an example, changing color while dimming the luminaire, changing color between daytime and nighttime modes, and changing between most efficient and points in between.

38 Claims, 4 Drawing Sheets

(56) References Cited

U.S. PATENT DOCUMENTS

| | | | |
|---|---|---|---|
| 6,061,160 A | 5/2000 | Maruyama | 359/152 |
| 6,066,861 A | 5/2000 | Hohn et al. | |
| 6,093,940 A | 7/2000 | Ishinaga et al. | 257/99 |
| 6,183,100 B1 | 2/2001 | Suckow et al. | 362/35 |
| 6,224,216 B1 | 5/2001 | Parker et al. | |
| 6,259,608 B1 | 7/2001 | Berardinelli et al. | |
| 6,296,367 B1 | 10/2001 | Parsons et al. | 362/183 |
| 6,297,598 B1 | 10/2001 | Wang et al. | 315/169.3 |
| 6,359,236 B1 | 3/2002 | DiStefano et al. | |
| 6,376,902 B1 | 4/2002 | Arndt | 257/678 |
| 6,454,437 B1 | 9/2002 | Kelly | 362/246 |
| 6,469,321 B2 | 10/2002 | Arndt | |
| 6,476,410 B2 | 11/2002 | Ishinaga | 257/13 |
| 6,501,084 B1 | 12/2002 | Sakai et al. | 250/504 R |
| 6,573,537 B1 | 6/2003 | Steigerwald et al. | 257/103 |
| 6,573,580 B2 | 6/2003 | Arndt | |
| 6,577,073 B2 | 6/2003 | Shimizu et al. | |
| 6,610,563 B1 | 8/2003 | Waitl | |
| 6,614,058 B2 | 9/2003 | Lin et al. | |
| 6,617,795 B2 | 9/2003 | Bruning | 315/151 |
| 6,624,491 B2 | 9/2003 | Waitl et al. | |
| 6,661,029 B1 | 12/2003 | Duggal | 257/89 |
| 6,680,490 B2 | 1/2004 | Yasukawa et al. | |
| 6,686,609 B1 | 2/2004 | Sung | |
| 6,707,069 B2 | 3/2004 | Song et al. | 257/79 |
| 6,710,373 B2 | 3/2004 | Wang | |
| 6,739,735 B2 | 5/2004 | Talamo et al. | 362/237 |
| 6,759,733 B2 | 7/2004 | Arndt | |
| 6,770,498 B2 | 8/2004 | Hsu | 438/26 |
| 6,774,401 B2 | 8/2004 | Nakada et al. | |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,909,123 B2 | 6/2005 | Hayashimoto et al. | 257/98 |
| 6,911,678 B2 | 6/2005 | Fujisawa et al. | |
| 6,919,586 B2 | 7/2005 | Fujii | |
| 6,940,704 B2 | 9/2005 | Stalions | |
| 6,946,714 B2 | 9/2005 | Waitl | |
| 6,948,825 B2 | 9/2005 | Christoph | 362/33 |
| 6,975,011 B2 | 12/2005 | Arndt | |
| 6,995,510 B2 | 2/2006 | Murakami et al. | |
| 7,002,546 B1 | 2/2006 | Stuppi et al. | 345/102 |
| 7,015,512 B2 | 3/2006 | Park et al. | 257/99 |
| 7,021,797 B2 | 4/2006 | Minano et al. | 362/355 |
| 7,064,907 B2 | 6/2006 | Kaneko | |
| 7,066,626 B2 | 6/2006 | Omata | |
| 7,095,053 B2 | 8/2006 | Mazzochette et al. | 257/81 |
| 7,102,213 B2 | 9/2006 | Sorg | |
| 7,119,422 B2 | 10/2006 | Chin | 257/666 |
| 7,202,613 B2* | 4/2007 | Morgan et al. | 315/312 |
| 7,204,607 B2 | 4/2007 | Yano et al. | 362/231 |
| 7,213,940 B1 | 5/2007 | Van de Ven et al. | |
| 7,224,000 B2 | 5/2007 | Aanegola et al. | 257/98 |
| 7,259,400 B1 | 8/2007 | Taskar | 257/98 |
| 7,285,802 B2 | 10/2007 | Ouderkirk et al. | 257/98 |
| 7,355,562 B2 | 4/2008 | Schubert et al. | 345/1.3 |
| 7,381,995 B2 | 6/2008 | Tain et al. | |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,605,452 B2 | 10/2009 | Yamanaka et al. | 257/676 |
| 7,621,655 B2 | 11/2009 | Roberts et al. | 362/249.02 |
| 7,665,861 B2 | 2/2010 | Blumel et al. | 362/249.02 |
| 7,723,744 B2 | 5/2010 | Gillies et al. | 257/98 |
| 7,897,980 B2 | 3/2011 | Yuan et al. | 257/88 |
| 7,902,560 B2 | 3/2011 | Bierhuizen et al. | 257/82 |
| 8,022,626 B2 | 9/2011 | Hamby et al. | 313/512 |
| 8,272,757 B1 | 9/2012 | Fan et al. | 362/231 |
| 2002/0001193 A1 | 1/2002 | Osawa et al. | 362/249 |
| 2002/0029071 A1 | 3/2002 | Whitehurst | |
| 2002/0061174 A1 | 5/2002 | Hurt et al. | |
| 2002/0070681 A1 | 6/2002 | Shimizu et al. | 315/246 |
| 2002/0093820 A1 | 7/2002 | Pederson | 362/241 |
| 2002/0113246 A1 | 8/2002 | Nagai et al. | |
| 2002/0123163 A1 | 9/2002 | Fujii | |
| 2002/0163001 A1 | 11/2002 | Shaddock | |
| 2002/0171911 A1 | 11/2002 | Maegawa | |
| 2002/0195935 A1 | 12/2002 | Jager | |
| 2003/0053310 A1 | 3/2003 | Sommers et al. | |
| 2003/0058641 A1 | 3/2003 | Watanabe et al. | 362/235 |
| 2003/0072153 A1 | 4/2003 | Matsui et al. | |
| 2003/0147055 A1 | 8/2003 | Yokoyama | 353/98 |
| 2003/0183852 A1 | 10/2003 | Takenaka | |
| 2003/0189829 A1 | 10/2003 | Shimizu et al. | 362/240 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0099874 A1 | 5/2004 | Chang et al. | 257/98 |
| 2004/0104391 A1 | 6/2004 | Maeda et al. | 257/79 |
| 2004/0126913 A1 | 7/2004 | Loh | |
| 2004/0184272 A1 | 9/2004 | Wright et al. | 362/373 |
| 2004/0227149 A1 | 11/2004 | Ibbetson | |
| 2004/0232435 A1 | 11/2004 | Hofer | |
| 2004/0238930 A1 | 12/2004 | Arndt | |
| 2004/0239242 A1 | 12/2004 | Mano et al. | |
| 2004/0245532 A1 | 12/2004 | Maeda et al. | 257/89 |
| 2004/0256626 A1 | 12/2004 | Wang | |
| 2005/0023548 A1 | 2/2005 | Bhat | |
| 2005/0057929 A1 | 3/2005 | Yano et al. | 362/240 |
| 2005/0072981 A1 | 4/2005 | Suenaga | |
| 2005/0093005 A1 | 5/2005 | Ruhnau | |
| 2005/0093422 A1 | 5/2005 | Wang | |
| 2005/0122018 A1 | 6/2005 | Morris | 313/46 |
| 2005/0127377 A1 | 6/2005 | Arndt | |
| 2005/0179376 A1 | 8/2005 | Fung et al. | |
| 2005/0225976 A1 | 10/2005 | Zampini | |
| 2005/0276053 A1 | 12/2005 | Nortrup et al. | 362/294 |
| 2006/0017402 A1 | 1/2006 | McKinney | |
| 2006/0022212 A1 | 2/2006 | Waitl | |
| 2006/0049477 A1 | 3/2006 | Arndt | |
| 2006/0105478 A1 | 5/2006 | Camras et al. | 438/22 |
| 2006/0105484 A1 | 5/2006 | Basin et al. | 438/27 |
| 2006/0108594 A1 | 5/2006 | Iwasaki et al. | |
| 2006/0157828 A1 | 7/2006 | Sorg | |
| 2006/0180818 A1 | 8/2006 | Nagai et al. | |
| 2006/0258028 A1 | 11/2006 | Paolini et al. | 438/22 |
| 2006/0289878 A1 | 12/2006 | Brunner et al. | 257/89 |
| 2007/0013057 A1 | 1/2007 | Mazzochette | |
| 2007/0030676 A1 | 2/2007 | Ichihara | |
| 2007/0046176 A1 | 3/2007 | Bukesov et al. | |
| 2007/0109779 A1 | 5/2007 | Sekiguchi et al. | |
| 2007/0115670 A1 | 5/2007 | Roberts et al. | |
| 2007/0139920 A1 | 6/2007 | Van De Ven et al. | |
| 2007/0188427 A1* | 8/2007 | Lys et al. | 345/82 |
| 2007/0223219 A1 | 9/2007 | Medendorp, Jr. et al. | |
| 2007/0252924 A1 | 11/2007 | Haga et al. | 349/68 |
| 2007/0269586 A1 | 11/2007 | Leatherdale | |
| 2007/0291467 A1 | 12/2007 | Nagai et al. | 362/84 |
| 2007/0295972 A1 | 12/2007 | Tsai et al. | |
| 2008/0024696 A1 | 1/2008 | Arai et al. | 349/62 |
| 2008/0074029 A1 | 3/2008 | Suehiro | |
| 2008/0100774 A1 | 5/2008 | Jeon et al. | |
| 2008/0112164 A1 | 5/2008 | Teshirogi | 362/231 |
| 2008/0128735 A1 | 6/2008 | Yoo | |
| 2008/0130298 A1 | 6/2008 | Negley et al. | |
| 2008/0136313 A1 | 6/2008 | van de Ven et al. | |
| 2008/0137357 A1 | 6/2008 | Friedrichs et al. | |
| 2008/0142816 A1 | 6/2008 | Bierhuizen et al. | 257/82 |
| 2008/0151527 A1 | 6/2008 | Ueno | |
| 2008/0170396 A1 | 7/2008 | Yuan et al. | 362/244 |
| 2008/0179611 A1 | 7/2008 | Chitnis et al. | |
| 2008/0186702 A1 | 8/2008 | Camras et al. | |
| 2008/0204366 A1 | 8/2008 | Kane et al. | 345/44 |
| 2008/0232079 A1 | 9/2008 | Awazu | 362/3 |
| 2008/0238335 A1 | 10/2008 | Lee | |
| 2008/0285268 A1 | 11/2008 | Oku et al. | 362/231 |
| 2009/0050907 A1 | 2/2009 | Yuan et al. | |
| 2009/0050908 A1 | 2/2009 | Yuan et al. | |
| 2009/0160363 A1 | 6/2009 | Negley | |
| 2009/0167185 A1* | 7/2009 | Cheng | 315/56 |
| 2009/0195189 A1* | 8/2009 | Zampini et al. | 315/295 |
| 2009/0201679 A1 | 8/2009 | Konaka | 362/235 |

(56) References Cited

U.S. PATENT DOCUMENTS

| | | | | |
|---|---|---|---|---|
| 2009/0231832 | A1 | 9/2009 | Zukauskas et al. | 362/84 |
| 2009/0237006 | A1* | 9/2009 | Champion et al. | 315/297 |
| 2009/0257240 | A1 | 10/2009 | Koike | 362/538 |
| 2009/0316073 | A1 | 12/2009 | Chen et al. | 349/64 |
| 2010/0046231 | A1 | 2/2010 | Medinis | 362/294 |
| 2010/0148703 | A1* | 6/2010 | Mizuno | 315/312 |
| 2010/0149783 | A1 | 6/2010 | Takenaka et al. | 362/84 |
| 2010/0219770 | A1* | 9/2010 | Kim et al. | 315/294 |
| 2011/0148327 | A1* | 6/2011 | Van de Ven et al. | 315/312 |

FOREIGN PATENT DOCUMENTS

| | | |
|---|---|---|
| CN | 1581527 A | 2/2005 |
| CN | 1591924 A | 3/2005 |
| CN | 1679168 A | 10/2005 |
| CN | 1744335 A | 3/2006 |
| CN | 1983590 A | 6/2007 |
| EP | 1005085 A2 | 5/2000 |
| EP | 1187226 A1 | 3/2002 |
| EP | 1187227 | 3/2002 |
| EP | 1187228 | 3/2002 |
| EP | 1521313 | 4/2005 |
| EP | 2056363 A2 | 5/2009 |
| JP | 03209781 | 9/1991 |
| JP | 8139257 | 5/1996 |
| JP | 09246602 | 9/1997 |
| JP | 10012915 | 1/1998 |
| JP | 2000223752 | 8/2000 |
| JP | 2001057446 | 2/2001 |
| JP | 2002184207 | 6/2002 |
| JP | 2003-168305 | 6/2003 |
| JP | 2003168305 | 6/2003 |
| JP | 2004512687 | 4/2004 |
| JP | 2005-228695 | 8/2005 |
| JP | 2006054329 A | 2/2006 |
| JP | 2006-128512 | 5/2006 |
| JP | 2006128512 | 5/2006 |
| JP | 2006173271 | 6/2006 |
| JP | 2006261375 | 9/2006 |
| JP | 200759260 | 3/2007 |
| JP | 2007189239 | 7/2007 |
| JP | 2007519221 | 7/2007 |
| JP | 2007251214 | 9/2007 |
| JP | 2007529105 | 10/2007 |
| JP | 2010511978 | 4/2010 |
| WO | WO 9931737 | 6/1999 |
| WO | WO 0217405 | 2/2002 |
| WO | 0297884 A1 | 12/2002 |
| WO | WO 02/097884 A1 | 12/2002 |
| WO | WO 2004/027882 | 4/2004 |
| WO | WO 2004044877 | 5/2004 |
| WO | WO 2005/013365 A2 | 2/2005 |
| WO | WO 2005013365 A2 | 2/2005 |
| WO | WO 2005043627 A1 | 5/2005 |
| WO | WO 2006/001221 A1 | 1/2006 |
| WO | WO 2006054228 A2 | 5/2006 |
| WO | WO 2006054228 A3 | 5/2006 |
| WO | WO 2006068297 | 6/2006 |
| WO | 2006135005 | 12/2006 |
| WO | WO 2007121486 A2 | 10/2007 |
| WO | WO 2007126720 A2 | 11/2007 |
| WO | WO 2009/157999 A1 | 12/2009 |

OTHER PUBLICATIONS

Cree LED Lighting data sheets for LR4, LR6 and LR24 LEDs, dated: 1996, available at http://creeledlighting.com/LR6.htm, http://creeledlighting.com/LR4.htm and http://creeledlighting.com/LR24.htm as reviewed on Oct. 15, 2009.
Negley and van de Ven, "Essentials of Designing Efficient Luminaries with LEDs", LEDs Magazine, Jan./Feb. 2008, pp. 17-22.
Cree LED Lighting, LR24—Architectural Luminaire Designed for Offices, Schools, Hospitals, and Retail Environments., Data Sheet 1996-2009, available from http://www.creeledlighting.com/LR24.htm, as retrieved on Mar. 16, 2010.
Cree LED Lighting, LR6—The First Viable LED Downlight for Commercial and Residential Applications., Data Sheet 1996-2009, available from http://www.creeledlighting.com/LR6.htm,as retrieved on Mar. 16, 2010.
Cree LED Lighting, LR4—Four-inch Architectural Downlight with Smooth, Low-brightness Aperture Appearance, Data Sheet 1996-2009, available from http://www.creeledlighting.com/LR24.htm,as retrieved on Mar. 16, 2010.
PCT Preliminary Report and Written Opinion from PCT Appl. No. PCT/US2011/001200, dated Jan. 17, 2013.
Search Report from Chinese Patent Application No. 200980125244. X, dated Nov. 5, 2012.
Second Office Action from Chinese Patent Application No. 200980125244.X, dated Nov. 26, 2012.
First Office Action from Chinese Patent Application 200980142352. 8, dated Aug. 27, 2012.
Reason for Rejection for Japanese Patent Application No. 2011-510484, dated Aug. 7, 2012.
First Office Action for Chinese Patent Application No. 200980125244.X, dated May 28, 2012.
Notice of Reasons for Rejection in Japanese Patent Application No. 2011-512442, dated Aug. 7, 2012.
JP 2001 060072A, Abstract, Matsushita Electric Ind. Co Ltd., Mar. 6, 2001.
International Search Report and Written Opinion From Related PCT Application No. PCT/US2009/001628, dated: Dec. 3, 2009.
Lamina, Inc., Titan Turbo™ LED Light Engines, Data Sheet, 2008.
Cree, Inc. Cree® XLamp® XR-E and XR-C LED Data Sheet, 2007, pp. 1-11.
Cree, Inc. Cree® EZ1000™ EZBright LED Data Sheet, 2006,pp. 1-6.
Cree, Inc. Cree® EZ700™ EZBright LED Data Sheet, 2006, pp. 1-6.
U.S. Appl. No. 11/656,759, filed Jan. 22, 2007 and U.S. Appl. No. 11/899,790, filed Sep. 7, 2007, "Wafer Level Phosphor Coating Method and Devices Fabricated Utilizing Method".
U.S. Appl. No. 11/473,089, filed Jun. 21, 2006, "Close Loop Electrophoretic Deposition of Semiconductor Devices".
Nichia Corp. White LED Part No. NSPW300BS, Specification for Nichia White LED, Model NSPW300BS, Jan. 14, 2004.
Nicha Corp., White LED Part No. NSPW312BS, Specification for Nichia White LED, Model NSPW312BS, Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44. No. 20-23, Jan. 1, 2005 XP-001236966, pp. 649-651.
Office Action from U.S. Appl. No. 12/154,691, dated: Sep. 29, 2009.
Response from U.S. Appl. No. 12/154,691, dated: Nov. 23, 2009.
Office Action from U.S. Appl. No. 12/154,691, dated: Dec. 17, 2009.
Response from U.S. Appl. No. 12/154,691, dated: May 17, 2010.
Notice of Allowance for U.S. Appl. No. 12/154,691, dated: Jun. 17, 2010.
PCT Invitation to Pay Additional Fees and Communication Relating to the Results of Partial International Search for related PCT application No. PCT/US2009/001628, dated: Oct. 12, 2009.
Declaration of Gerald Negley under 37 C.F.R. §1.132, Dated: Aug. 20, 2009.
Declaration of Charles Swoboda under 37 C.F.R. §1.132, Dated: Aug. 20, 2009.
Office Action from U.S. Appl. No. 12/156,995, dated: Nov. 17, 2010.
International Search Report and Written Opinion from PCT Application No. PCT/US2010/003190 Mailed Apr. 6, 2011.
Office Action from U.S. Appl. No. 12/288,957, dated: Sep. 21, 2010.
Response to Office Action from U.S. Appl. No. 12/288,957, filed: Dec. 21, 2010.
Office Action from U.S. Appl. No. 12/629,735, dated: Sep. 22, 2010.
Response to Office Action from U.S. Appl. No. 12/629,735, filed: Dec. 22, 2010.
Office Action from U.S. Appl. No. 12/288,957, dated: Mar. 9, 2011.
Office Action from U.S. Appl. No. 12/629,735, dated: Mar. 10, 2011.
Office Action from U.S. Appl. No. 12/156,995, dated: Mar. 10, 2010.

(56) References Cited

OTHER PUBLICATIONS

Response to Office Action from U.S. Appl. No. 12/156,995, filed: Sep. 10, 2010.
Response to Office Action from U.S. Appl. No. 12/156,995, filed: Apr. 18, 2011.
International Search Report and Written Opinion for PCT/US2010/003168 mailed Apr. 26, 2011.
International Search Report and Written Opinion from PCT/US2011/001200, dated Apr. 27, 2012.
First Office Action for Chinese Patent Application No. 201230001815.3, dated Apr. 11, 2012.
Summary of Notice of Reasons for Rejection from Japanese Patent Application No. 2007-228699, dated May 8, 2012.
Notice of Reasons for Rejection for Japanese Patent Application No. 2008-221738 dated Aug. 3, 2011.
Notice of Reasons for Rejection for Japanese Patent Application No. JP 2007-228699 mailed May 10, 2011.
Notification of National Application upon the Preliminary Examination of Patent Application for counterpart Chinese Patent Application No. 200980125244.X mailed May 25, 2011.
EPO Communication Pursuant to Rule 161(1) and 162 EPC for European Patent Application No. 09750906.1 dated Feb. 1, 2011.
Communication Pursuant to Article 94(3) EPC for European Patent Application No. 09 758 647.3-1226, dated Jun. 21, 2011.
EPO Communication Pursuant to Rule 161(1) and 162 EPC for counterpart European Patent Application No. 09758647.3 dated Jan. 24, 2011.
Notice of Reasons for Rejection from Japanese Patent Application No. 2008-221738, dated May 29, 2012.
Response to Office Action from U.S. Appl. No. 11/962,276. dated Aug. 7, 2012.
Response to Office Action from U.S. Appl. No. 11/982,276 dated Oct. 10, 2012.
Response to Office Action from U.S. Appl. No. 12/288,957 dated Mar. 26, 2013.
Response to Office Action from U.S. Appl. No. 12/544,131 dated Jan. 15, 2013.
Response to Office Action from U.S. Appl. No. 12/626,735 dated Feb. 8, 2013.
Response to Office Action from U.S. Appl. No. 12/643,670 dated Oct. 1, 2012.
Response to Office Action from U.S. Appl. No. 12/643,705 dated Jun. 13, 2012.
Response to Office Action from U.S. Appl. No. 12/862,640 dated Jan. 24, 2013.
Response to Office Action from U.S. Appl. No. 13/029,005 dated Jan. 24, 2013.
Response to Office Action from U.S. Appl. No. 12/177,415 dated Jan. 25, 2013.
Response to Office Action from U.S. Appl. No. 13/489,035 dated Jan. 22, 2013.
Second Office Action from Chinese Patent Application No. 200980142352.8, dated May 6, 2013.
Third Office Action from Chinese Patent Application No. 200980125244.X, dated May 31, 2013.
Notice of Reasons for Rejection from Japanese Patent Application No. 2011-533175, dated Apr. 2, 2013.
Decision of Rejection from Japanese Patent Application No. 2008-221738, dated Feb. 26, 2013.
Decision of Dismissal of Amendment from Japanese Patent Application No. 2008-221738, dated Feb. 26, 2013.
Office Action from Japanese Patent Application No. 2011-512442, dated Feb. 22, 2013.
Satoshi Emoto, "How to make Mobile", [on line], May 30. 2001. ITmedia (searched on Feb. 15, 2013), internet URL: http//www.itmedia.co.jp/mobile/rensai/howtomake/04.
Office Action from Japanese Patent Appl. No. 2007-228699, dated Mar. 6, 2013.
Office Action from U.S. Appl. No. 12/156,995, dated Apr. 12, 2012.
Office Action from U.S. Appl. No. 11/982,276, dated Aug. 7, 2012.
Office Action from U.S. Appl. No. 12/643,670, dated Oct. 1, 2012.
Office Action from U.S. Appl. No. 11/982,276, dated Oct. 10, 2012.
Office Action from U.S. Appl. No. 13/489,035, dated Jan. 22, 2013.
Office Action from U.S. Appl. No. 12/862,640, dated Jan. 24, 2013.
Office Action from U.S. Appl. No. 13/029,005, dated Jan. 24, 2013.
Office Action from U.S. Appl. No. 13/177,415, dated Jan. 25, 2013.
Office Action from U.S. Appl. No. 12/629,735, dated Feb. 8, 2013.
Office Action from U.S. Appl. No. 12/643,705, dated Jun. 13, 2012.
Office Action from U.S. Appl. No. 11/982,276, dated May 29, 2013.
Office Action from U.S. Appl. No. 12/862,640, dated Apr. 30, 2013.
Office Action from U.S. Appl. No. 12/288,957, dated Mar. 26, 2013.
Office Action from U.S. Appl. No. 13/177,415, dated May 2, 2013.

* cited by examiner

US 8,598,809 B2

WHITE LIGHT COLOR CHANGING SOLID STATE LIGHTING AND METHODS

BACKGROUND OF THE INVENTION

1. Field of the Invention

This invention relates to solid state lighting (SSL) and in particular to SSL luminaires having a plurality of different emitter types that combine to provide the desired luminaire emission while still allowing for emission color changing between the colors of the emitter types.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 253 on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LEDs and LED packages, such as those shown in FIGS. 1 and 2, are more commonly being used for lighting applications that were previously the domain of incandescent or fluorescent lighting. The LEDs and LED packages can be arranged as the light source in SSL luminaires and single or multiple LEDs or LED packages can be used. The general acceptance of these luminaires has accelerated with the improvement in LED emission efficiency and quality. LEDs have been demonstrated that can produce white light with an efficiency of greater than 150 L/w, and LEDs are expected to be the predominant commercially utilized lighting devices within the next decade.

The light generated by different light sources can be measured in terms of color rendering index (CRI or CRI Ra) and color temperature. CRT is a quantitative measurement of the ability of a light source to reproduce the colors of various objects faithfully in comparison with an ideal or natural light source. Light sources with a high CRI approaching 100 can be desirable in color-critical applications such as photography and cinematography. Daylight has a high CRI of approximately 100 and incandescent bulbs have a relatively close CRT of greater than 95. By comparison, fluorescent lighting has a lower CRI in the range of 70-80, and mercury vapor or sodium lamps have a much lower CRI of 40 or less. High quality light suitable for general indoor illumination should have a CRI of greater than 90.

Color temperature is a characteristic of light source that is determined by comparing the light's chromaticity with that of an ideal black-body radiator. The temperature (usually measured in kelvins (K)) at which the heated black-body radiator matches the color produced by the light source is that source's color temperature. For incandescent light sources the light is of thermal origin and is very close to that of an ideal black-body radiator. Higher color temperatures of 5000 K or more are "cool" and have green to blue colors while lower color temperatures of 2700 to 3500 K are considered "warm" and have yellow to red colors. General illumination can have a color temperature between 2,000 and 10,000 K, with the majority of general lighting devices being between 2,700 and 6,500 K.

In contrast to incandescent radiation, light sources such as fluorescent lamps emit light primarily by processes other than raising the temperature of a body. This means the emitted radiation does not follow the form of a black-body spectrum. These sources are assigned what is known as a correlated color temperature (CCT). CCT is the color temperature of a black body radiator which to human color perception most closely matches the light from the lamp. For high quality light sources it is also important that color of the illumination be as close as possible to that of a block body spectrum (i.e. black body locus on CIE chromaticity diagram). On such standard deviation is measured in terms of a MacAdam ellipses with a suitable proximity to the black body locus typically being within a 4-step MacAdam ellipse.

SSL luminaires have been developed that utilize a plurality of LEDs coated by a conversion material to produce the desired wavelength of white light. Some of these include blue emitting LEDs covered by a conversion material such as YAG:CE or Bose, and blue or UV LEDs covered by RGB phosphors. These methods have generally good efficacy, but only medium CRI. These have not been able to demonstrate both the desirable high CRT and high efficacy, especially with color temperatures between 2700K and 4000K.

Techniques for generating white light from a plurality of discrete light sources to provide improved CRI at the desired color temperature have been developed that utilize different hues from different discrete light sources. Such techniques are described in U.S. Pat. No. 7,213,940, entitled "Lighting Device and Lighting Method". In one such arrangement a 452 nm peak blue InGaN LEDs were coated with a yellow conversion material, such as a YAG:Ce phosphor, to provide a color that was distinctly yellow and had a color point that fell well above the black body locus. The yellow emission was combined with the light from reddish AlInGaP LEDs that "pulled" the yellow color of the yellow LEDs to the black body curve to produce warm white light. FIG. 3 shows a CIE diagram 30 with the tie lines 32 between red light 34 from red emitting LEDs and various yellow and yellowish points on the blue/YAG tie line 35. With this approach, high efficacy warm white light with improved CRI. Some embodiments exhibited improved efficacy, with CRI Ra of greater than 90 at color temperatures below 3500 K.

When utilizing discrete light sources to provide the desired characteristics, it is desirable to mix the light from the sources so that they are not individually visible, and it is also desirable to provide dimming capabilities. The LR6, LR4 and LR24 LED based lighting fixtures commercially available from Cree, Inc. (wwww.cree.com) all have dimming capability and these products dim by controlling the on-time for a constant current through the LEDs. Some of these products have three serially connected strings of LEDs, two strings comprising a plurality of blue emitting LEDs coated by a yellow conversion material ("blue shifted yellow" or "BSY") and one string comprises red emitting LEDs. The ratio of currents between the LED strings, and therefore, the color point of the fixture does not change during dimming. Conventional incandescent lamps do change color temperature while dimming, and as the light dims as it becomes more reddish. The consuming public has come to expect this type of emission during dimming.

Some lighting applications, such as onboard naval vessels, can also require different lighting during different operational conditions. For example, white light can be required for daytime operations and red light for night time operations. This light is typically provided by two separate light sources, typically fluorescent, one with no filter and one with a red filter.

SUMMARY OF THE INVENTION

The present invention provides SSL luminaires wherein the emission intensity of the discrete light sources can be varied to produce luminaire light having different characteristics. Different embodiments of the present invention can utilize the unique circuit topology of SSL luminaires to vary the emission intensity of different types of LEDs in the luminaire. In some embodiments, the different types of LEDs are connected in respective serial strings, and the intensity of emission of the LEDs in each of the strings can be varied by changing the electrical signal driving the strings. In some of these embodiments, white light is emitted from the SSL luminaire by combining emission from BSY and red LEDs and for these embodiments the color changing solutions according to the present invention can include, changing color while dimming the luminaire, changing color between daytime and nighttime modes, and changing between most efficient. The color changing can also produce colors at points in between these.

One embodiment of an SSL luminaire according to the present invention comprises a plurality of first LEDs and a plurality of second light emitting diodes emitting light with characteristics different from the first LEDs. A current control mechanism controls the intensity of light from the first and second LEDs, with the controller capable of changing the emission intensity of the first and second LEDs so that the SSL luminaire emits light having desired characteristics.

Another embodiment of a solid state lighting SSL luminaire according to the present invention comprises a plurality of first blue shifted yellow (BSY) LEDs, a plurality of second BSY LEDs emitting light with different characteristics than said first BSY LEDs, and a plurality of red LEDs. The relative emission intensities of the first, second and third LEDs can be varied so that the SSL luminaire emits a combination of light from the first, second and third LED with desired lighting characteristics.

Another embodiment of an SSL luminaire comprises a plurality of serially connected first LEDs, a plurality of serially connected second LEDs, and a plurality of serially connected third LEDs. The first, second and third LEDs have different emission characteristics, and the relative emission intensities of the first, second and third LEDs can be varied such that said SSL luminaire can be controlled to emit light with different lighting characteristics.

Still another embodiment of an SSL luminaire, comprises a plurality of first LEDs and a plurality of second LEDs that emit light with characteristics different from the first LEDs. The intensity of light from the first and second LEDs can be controlled so that the SSL luminaire produces a dominant emission from one of the first and second LEDs depending on the particular lighting condition.

These and other aspects and advantages of the invention will become apparent from the following detailed description and the accompanying drawings which illustrate by way of example the features of the invention.

DETAILED DESCRIPTION OF THE INVENTION

Figure 1:
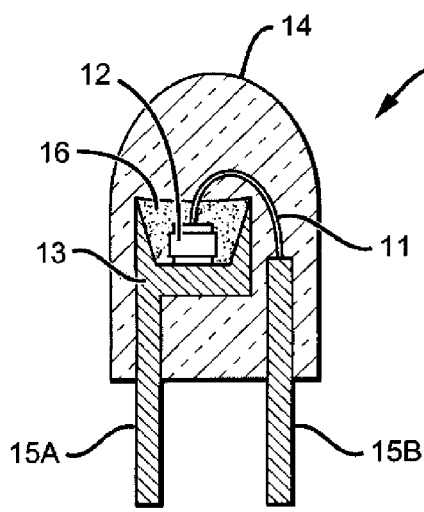
FIG. 1 shows a sectional view of one embodiment of a prior art LED lamp.
Figure 2:
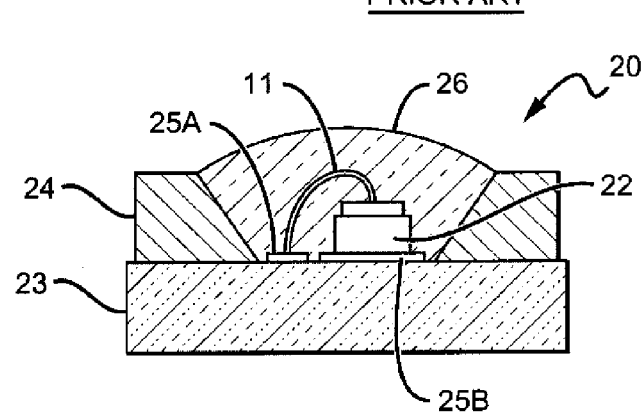
FIG. 2 shows a sectional view of another embodiment of a prior art LED lamp.

The present invention is directed to luminaires having multiple types of discrete emitters that combine to produce the desired standard luminaire emission, such as white light. The luminaires according to the present invention are arranged so that the emission from the different types of discrete emitters can be controlled to change emission from the standard operation condition. This arrangement can be used to produce dominant luminaire emission from one of the different types of discrete emitters in the luminaire to take advantage of the emitter's particular emission characteristics. The present invention can also be used to control the luminaire emission during different phases of operation, such as dimming, so that the luminaire mimics the operation of other types of luminaire. In one embodiment, an LED luminaire can be controlled to mimic the operation of incandescent based luminaires.

Embodiments of the present invention can take advantage of the unique circuit topologies of many SSL luminaires to change the emission color. The topology provides for SSL luminaires that can change emission to correspond to changing lighting needs and conditions. The topologies of SSL luminaires are uniquely arranged to provide for different modes of operation based on the architecture of the discrete sources. In embodiments having an architecture using separately controlled sets or strings of LEDs, such BSY and red LEDs, the luminaires according to the present invention can produce light predominantly from respective one of the groups of LEDs depending on the lighting condition. For example, in daytime mode the BSY and red LEDs can be driven to operate in a conventional manner by providing a white light. In night time (i.e. light blindness) low light mode, the BSY LEDs would be turned off or emission minimized, with one or more of the red LEDs emitting light. Furthermore, the red LEDs could be driven harder or additional red LEDs could be switched into the circuit if more light output was required in night time mode. Driving the red LEDs harder would typically not reduce their lifetime because the head sink would be sized to accommodate the red and the BSY LEDs and also because junction temperature is typically less critical to red LED lifetime compared to LEDs using a phosphor, such as BSY LEDs. In applications such as naval operations, it may be desirable to change between night time and day time operating conditions and the architecture of SSL luminaires according to the present invention allow for this manipulation.

Some SSL luminaires may also have certain sets or strings of LEDs that have higher emission efficiency than others. Embodiments of SSL luminaires according to the present invention also allow for controlling of the strings of LEDs so that dominant emission is provided by the string with the desired emission efficiency. This is particularly applicable to operational conditions that require maximized light emission efficiency. Certain of the strings may also posses certain other characteristics, such as CRI, color temperature and operating temperature, and the luminaires according to the present invention can be arranged to provide dominant emission from the string with the desired ones of these characteristics. It is also understood that the emission of the different strings can be controlled to provide a combination of emission with the desired characteristics different from normal operation such as white light emission.

In embodiments where the color point of the luminaire is manipulated during dimming, certain ones of the LED types can be dimmed disproportionately to the others. This can allow for the color point of the luminaire to more accurately reflect dimming of conventional incandescent lighting devices (reddish). In one embodiment having one or more BSY strings and a red string, the color point can be changed through dimming, by dimming the BSY strings only or by dimming the BSY strings disproportionately to the red string.

The present invention is described herein with reference to certain embodiments, but it is understood that the invention can be embodied in many different forms and should not be construed as limited to the embodiments set forth herein. In particular, the present invention is described below in regards to certain lamps or lighting components or luminaires having arrays of LEDs or LED chips in different configurations. These are generally referred to as SSL luminaires, but it is understood that the present invention can be used for many other lamps having many different array configurations of different emitter types. The components can have different shapes and sizes beyond those shown and different numbers of LEDs can be included in the arrays. Some or all of the LEDs in the arrays can be coated with a down-converter coating that can comprise a phosphor loaded binder ("phosphor/binder coating"), but it is understood that LEDs without a conversion material can also be used.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, and/or sections, these elements, components, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
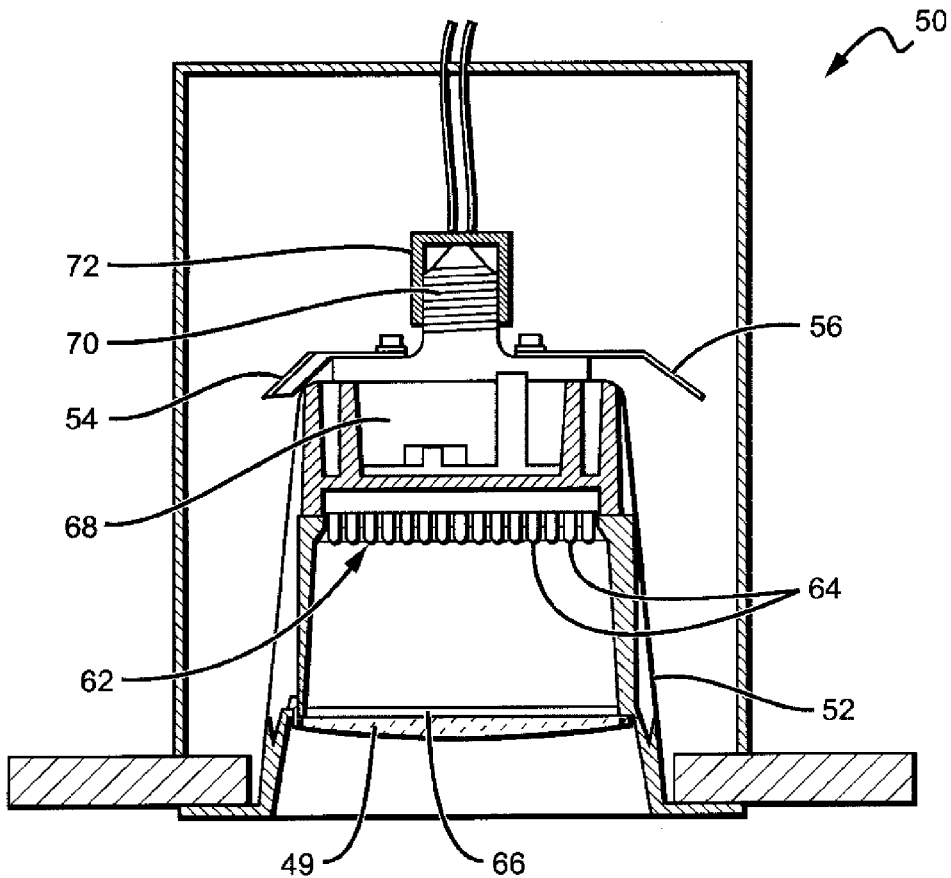
FIG. 4 is a sectional view of one embodiment of an SSL luminaire according to the present invention.

It is understood that the arrangements described herein can be utilized in many different luminaires having different features arranged in different ways. FIG. 4 shows one embodiment of a luminaire 50 that can have LEDs and other components/mechanisms arranged according to the present invention (See U.S. Patent Application Publication No. 2008/0130298 to Negley et al., entitled "Self-Ballasted Solid State Lighting Devices", the entirety of which is hereby incorporated by reference).

The luminaire 50 comprises a housing 52 with first mounting clip 54, a second mounting clip 56, and a third mounting clip (not visible in FIG. 1). A light engine 62 is arranged in the housing and comprises a plurality of solid state light emitters 64 that in this embodiment are LEDs. A diffuser 66 is included over the housing opening, and a power supply/converter 68 is included. The housing 52 also comprises an electrical connection region 70 which is engageable with an electricity supply device 72 (in this embodiment, an Edison socket).

The power supply/converter 68 is positioned within the housing and can comprise a conventional rectifier and high voltage converter. If power of an AC voltage is supplied to the first region of the energy forwarding element 62 converts the AC power and supplies energy to the light engine 68 in a form such that the solid state light emitters 64 emit light.

In this embodiment, the diffuser 66 can be designed in such a manner to promote effective color mixing, depixelization, and high optical efficiency. The diffuser 66 can be attached to the housing 52 via mechanical snap-fit to the lower housing in such a manner that it requires the device to be uninstalled (powered down) to remove it, and/or the diffuser (lens) can be permanently attached (i.e., removal would require breakage), e.g., by heat staking, suitable heat staking techniques being well-known in the art.

Figure 5:
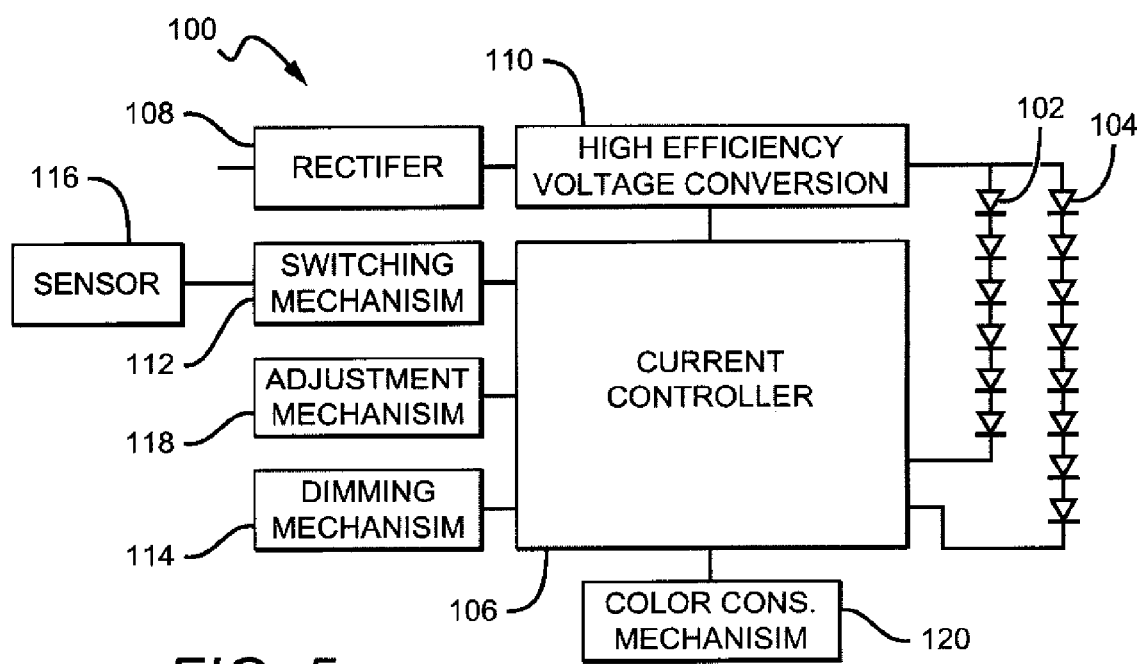
FIG. 5 is a schematic showing the interconnects between the components in one embodiment of an ESL luminaire according to the present invention.

FIG. 5 shows an interconnect schematic of the components for one embodiment of an SSL luminaire 100 according to the present invention. The SSL luminaire 100 can comprise two sets or strings of LEDs shown as a first plurality LEDs 102 and second plurality of LEDs 104. In the embodiment shown, each of the first and second plurality of LEDs 102, 104 are serially connected in a respective string, but it is understood that they can be interconnected in many different serial and parallel combinations. The luminaire 100 can also comprise a current controller 106 to set the drive current first and second LEDs 102, 104 during operation, and in one embodiment the drive current for both can be set during manufacturing so that the intensity of light from the first and second plurality of light combines to produce the desired CRI and color temperature, such as a white light. The luminaire 100 also comprises a conventional rectifier 108 and high voltage converter 110 to accept a line voltage and convert it to an electrical signal useful for driving LEDs. It is understood that many different conversion arrangements can be provided to convert the line voltage, and other power sources can be utilized beyond line voltages.

The luminaire according to the present invention can have a switching mechanism 112 that can comprise different conventional mechanical or electronic switches. The switching mechanism 112 can be directly coupled to the first and second LEDs 102, 104 using conventional methods or can be connected to the first and second LED 102, 104 through another mechanism such as the current controller 106. The switching mechanism 112 can be operated to turn off one of the strings of first and second LEDs 102, 104. This can be done to customize the emission of the luminaire to meet changing lighting needs as discussed above. By switching off the first plurality of LEDs, the luminaire emits the light only from the second plurality of LEDs, and by switching off the second plurality of LEDs, the luminaire emits the light only from the first plurality of LEDs. In different embodiments the switching mechanism 112 can be manually operated or can be operated automatically in response to different sensors 116, such as lighting sensors or sensors that monitor the available electrical power for lighting. These are only a couple examples of sensors that can be utilized to operate the switching mechanism 112.

In this arrangement the different emission characteristics presented by first and second plurality of LEDs can be utilized to more closely match changing lighting needs. As discussed above, the first or second plurality of LEDs can be characterized by having different emissions efficiencies or emission colors, as well as different CRIs, or color temperatures. Lighting needs at certain locations can change and certain of these distinct characteristics can be taken advantage of to more closely compliment the current lighting needs. For example, one of the first and second LEDs 102, 104 may have higher emission efficiency, and is most desirable in a lighting situation where the most efficient emission efficiency is needed. One of the first and second LEDs 102, 104 may also exhibit lighting colors or characteristics applicable to night vision. Under night vision conditions the other of the first and second plurality of LEDs can be switched off. These are only a couple examples of the characteristics of the luminaire that can be manipulated according to the present invention to match changing lighting needs.

One embodiment can comprise an arrangement as discussed above and described in U.S. Pat. No. 7,213,940 to Van de Ven et al., entitled "Lighting Device and Lighting Method", the entirety of which is incorporated by reference. The first LEDs 102 can comprise a BSY LEDs emitting distinctly yellow light and can have a color point that is well above the black body locus. The second plurality of LEDs can emit a reddish color at the necessary intensity to "pull" the yellow color of the first LEDs back to the black body curve to produce warm white light. In this embodiment the switching mechanism 112 can be operated to turn off either one of the first and second LEDs 102, 104. The first LEDs 102 can be turned off to allow the luminaire to emit red light for night vision operation. The second LEDs 104 can be turned off to emit more efficient light from the first BSY LEDs 102.

Figure 3:
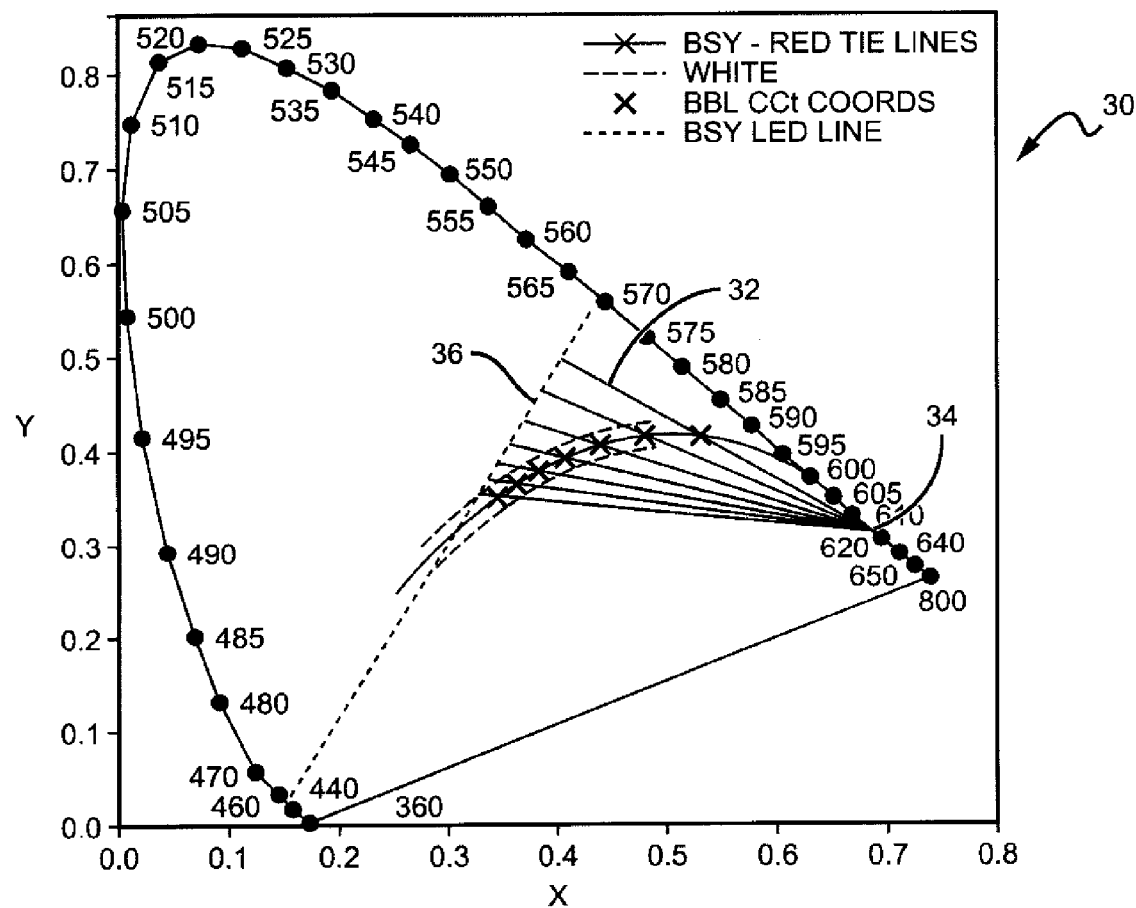
FIG. 3 is a CIE diagram showing the tie lines between BSY and red emitters.

For the embodiment having BSY and red emitting LEDs 102, 104 the diagram in FIG. 3 shows different tie lines 32 on a CIE diagram between the red color of the second LEDs 104 and various yellow and yellowish points in the first LEDs 102 of FIG. 5. The present invention can also comprise a light intensity current adjustment mechanism 118 that can be operated to vary the drive current to both the first and second LEDs 102, 104. Many different conventional adjustment mechanisms/arrangements can be used that manually or automatically control the drive current provided to the respective ones of the first and second LEDs 102, 104, and the particular adjustment can be manually operated or operated automatically, such as in response to sensors 116 as described above. For different embodiments corresponding to the tie lines shown in FIG. 3, the drive current to the first and second LEDs 102, 104 can be varied such that the emission of the luminaire can be at any point along the particular one of tie lines 32. Thus the output of the luminaire can provide multiple different emissions to meet the particular lighting needs. In different embodiments, the LEDs 102, 104 can be controlled so that the luminaire 100 emits light with a CRI of greater than 90. In other embodiments, luminaire 100 can emit light with a CRI of greater that 85 or 80.

The luminaire 100 can also comprise a dimming mechanism 114 which operates in much the same way as conventional dimming circuits by controlling the drive current to the first and second LEDs 102, 104 to dim the output intensity of the luminaire. In this embodiment, the dimmer mechanism 114 can work in conjunction with current controller 106, although in other embodiments it can operate directly on the first and second LED 102, 104. In this embodiment, the dimmer mechanism is particularly applicable to manipulating the manner in which the first and second LEDs 102, 104 are dimmed. That is, the current applied to the first and second LEDs 102, 104 through dimming may be controlled so that their intensity reduces at different rates. This can be particularly applicable where it is desirable for the LED based luminaire to mimic the dimming properties of different types of emitter. As discussed above, where luminaire 100 emits white light combination from the first and second LEDs 102, 104, the dimming mechanism can operate so that the luminaire mimics the emission properties if an incandescent based light through dimming; i.e. becomes more reddish. This is only one of the ways in which the current can be controlled during dimming and it is understood that many different controlling methods can be used to meet different needs during dimming.

The switching, dimming and adjustment mechanisms 112, 114, 118 are described above as separate mechanisms, and it is understood that these can comprise different mechanical or electronic components. It is further understood that these can be integrated into a single device or mechanism with others of features (such as the current controller) of the luminaire 100. In one such embodiment according to the present invention, the switching, dimming and adjustment mechanisms 112, 114, 118 can be combined with the current controller on an integrated circuit.

Many conventional LEDs can experience emission variations over their lifetime such a through normal operation or by being subject to environmental factors such as heat. The emission variation can be the result of changes to the LED semiconductor material, its conversion material, or its encapsulant. The luminaire 100 can comprise a color consistency mechanism 120 that monitors the emission of the first and second LEDs 102, 104 to compensate for emission variations over the lifetime of the luminaire. The mechanism 120 can contain different sensors, such as an optical sensor to monitor the light from the LEDs 102, 104 or heat sensor to measure the heat under which the LEDs 102, 104 are operating.

Figure 6:
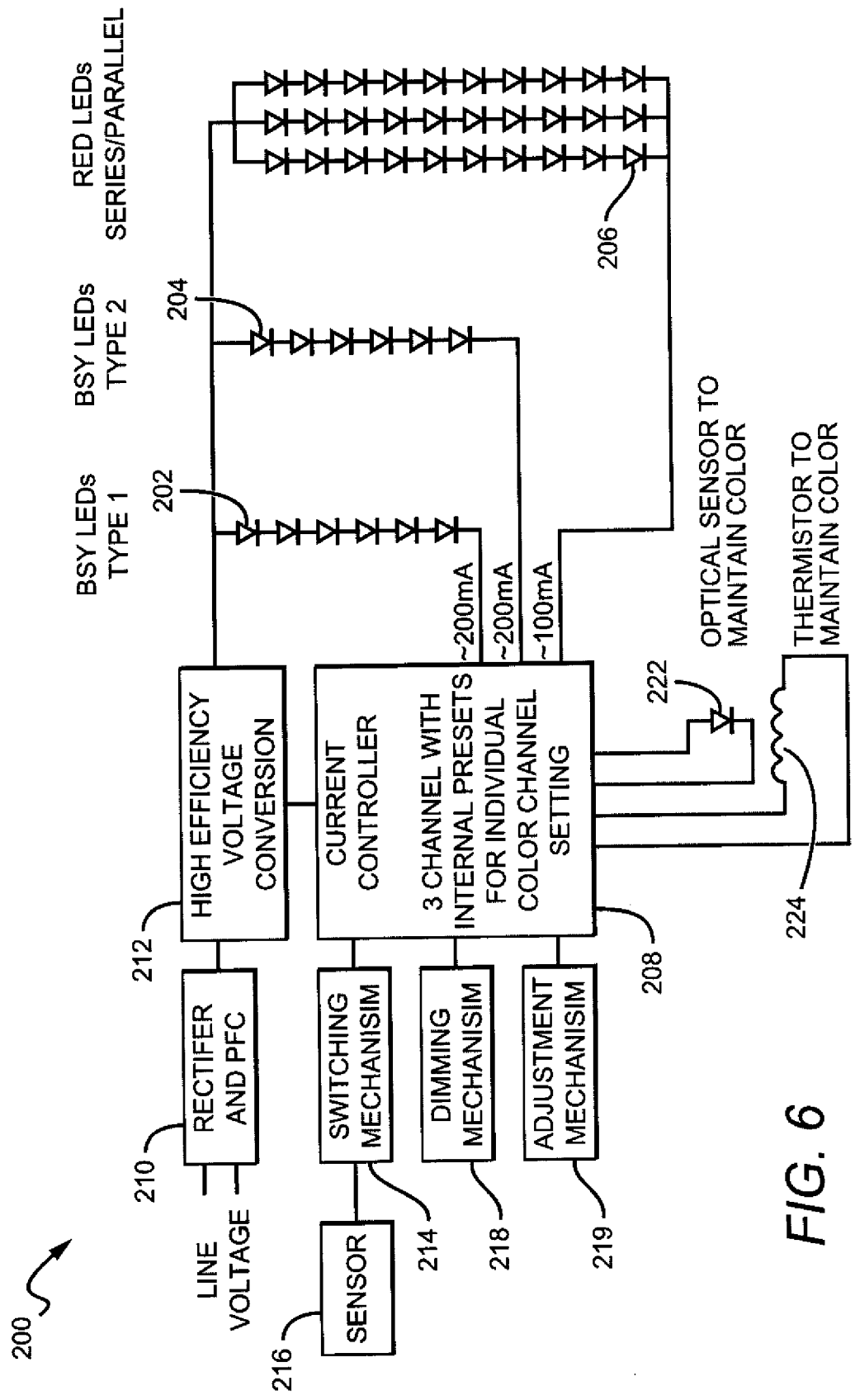
FIG. 6 is a schematic showing the interconnects between the components in another embodiment of an ESL luminaire according to the present invention.

It is understood that the present invention can be applied to luminaries having more than two sets of LEDs, including luminaries having, three, four or more sets of LEDs. FIG. 6 shows another embodiment of a interconnect schematic of the components in another embodiment of an SSL luminaire 200 according to the present invention, having first, second and third sets or strings of a plurality of LEDs 202, 204, 206 that can be arranged in many different SSL luminaires.

In the embodiment shown each of the first, second and third LEDs 202, 204, 206 is serially coupled with the others in its respective one of the sets. Like the embodiment above, it is understood that each of the first, second and third LEDs can be coupled in different series and parallel connections. The luminaire 200 further comprises a current controller 208 similar to the current controller 106 described above and shown in FIG. 5. The luminaire 200 also comprises a conventional rectifier 210 and high voltage converter 212 similar to the ones described above in FIG. 5.

The first, second and third LEDs 202, 204, 206 can be different LED types that emit light with different characteristics, with the combination of light from the three combining to produce a desired luminaire emission. In one embodiment, the first and second LEDs 202, 204 can be of the same emission type, but from slightly different bins to provide slightly different hues. In the embodiment shown they can comprise different BSY LEDs having different emission hues. (See U.S. Patent Application Publication No. 2008/0136313, to Van De Ven et al., entitled "Lighting Device and Lighting Method". the entirety of which are hereby incorporated by reference). The third LEDs can be a different type that emits a substantially different hue, such as red emitting LEDs.

Figure 7:
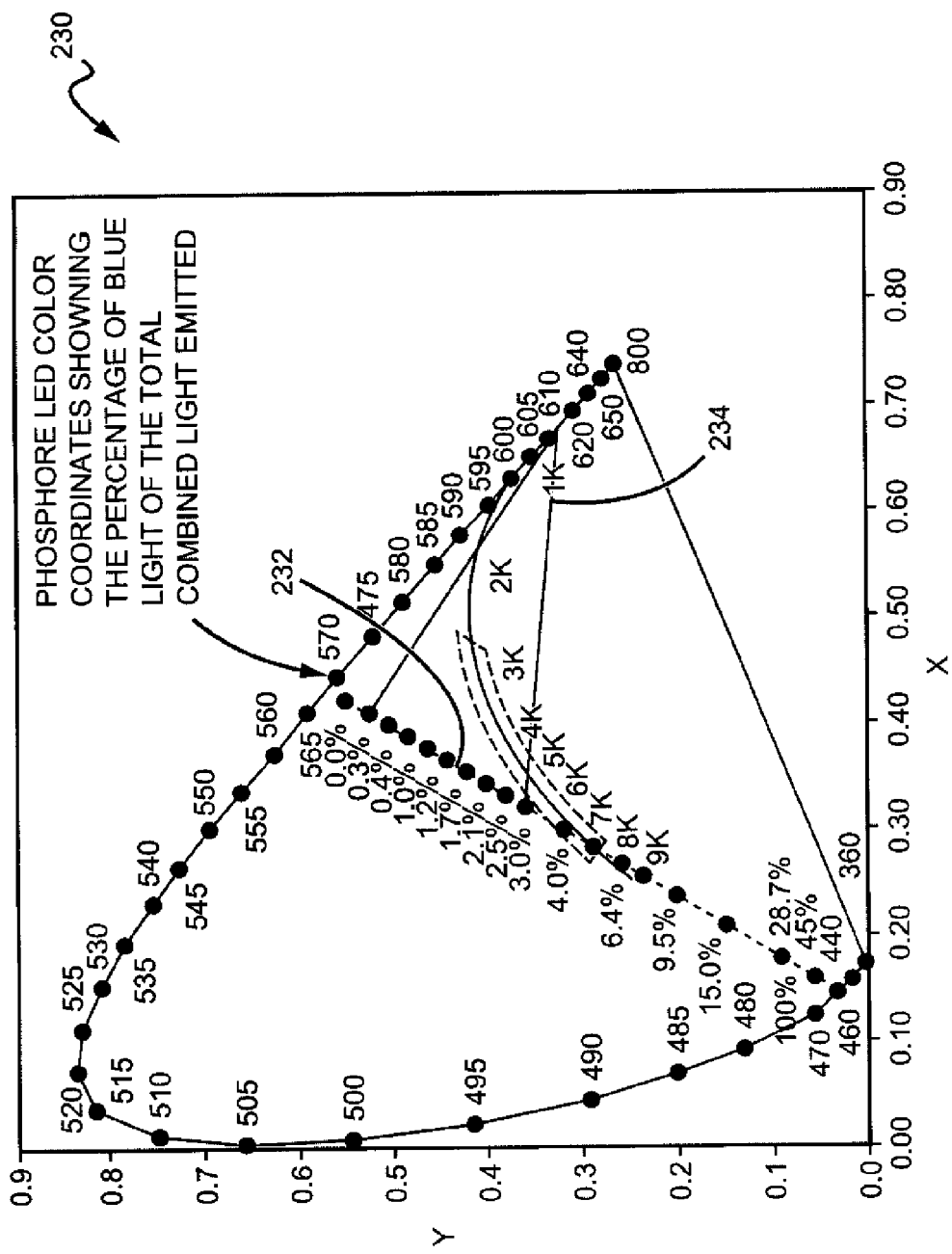
FIG. 7 is a CIE diagram showing the emissions of one embodiment of an SSL luminaire according to the present invention having different types of BSY and red emitters.

Referring now to FIG. 7 a CIE diagram 230 is shown with tie line 232 between the emission points of the first and second BSY LEDs 202, 204. In this embodiment, the first and second BSY LEDs 202, 204 are of intentionally different BSY hues, so that the relative intensities of those strings may be adjusted to move along the tie line 232 between the respective color coordinates on a CIE diagram for the two LEDs. The intensity of the third red LEDs can be adjusted to emission point 234 to tune the light output from the lighting device so that the emission is to the black body locus (or to within a desired minimum distance therefrom). In some embodiments, variation in individual LEDs within a string may be compensated for in the tuning process. Thus, by tuning after manufacture, the need for narrow bins of LEDs may be eliminated. This allows for a lighting device that provides the intended emitted white light and in particular, white light near the black body curve and having color temperature of 2700 K or 3500 K. Another important benefit provided by the present inventive subject matter is that the tuning process nulls out errors or offsets in the current sensing circuits.

The drive current and emission intensities of each of the first, second and third LEDs 202, 204, 206 can be set during manufacturing and the testing that follows so that the luminaire emits at the desired emission characteristics. The luminaire can also comprise a switching mechanism 214 that is arranged similar to the switching mechanism 112 above, but is arranged to switch off each of the first, second and third LEDs 202, 204, 206. The switching mechanism 214 can also turn off two of the first second and third LEDs 202, 204, 206. As above, when night vision is desired the first and second BSY LEDs 202, 204 can be switched off by the switching mechanism 214. When the characteristics of the first and second BSY LEDs 202, 204 is desired, the red emitting LEDs can be switched off by the switching mechanism 214. Further, when the emission characteristics of one of the first and second BSY LEDs 202, 204 is desired, the other of the first and second BSY LEDs can be switched off and the third red LEDs 206 can be switched off. Like above, the switching mechanism 214 can be manually operated or operated in response to sensors 216.

A dimming mechanism 218 can also be included that is similar to the dimming mechanism 114, but in this embodiment it is arranged such that it is capable of controlling the emission of the first, second and third LEDs 202, 204, 206 during dimming to provide the desired emission characteristics such as mimicking the dimming of incandescent based luminaires. The luminaire 200 can also comprise an adjustment mechanism 219 similar to adjustment mechanism 118 above that is arranged to control the emission of each of the first, second and third LEDs 202, 204, 206. Referring again to FIG. 7, adjustment mechanism 219 allows for the emission of each of the first, second and third LEDs to be controlled from zero to maximum emission. Accordingly, the emission of the luminaire 200 can fall within any point in the triangle formed by the SYS LED tie line 232 and the red LED emission point 234.

The luminaire can also comprise an open loop color consistency mechanism to maintain color consistency over the luminaire's lifetime. In this embodiment the color consistency is maintained by monitoring the light emitted from the LEDs 202, 204, 206 through an optical sensor 222 and the heat under which the LEDs operate through a thermistor 224. The outputs of the optical sensor 222 and thermistor 224 are provided to the current controller that can then adjust the current applied to the first, second and third LEDs 202, 204, 206 to adjust for emission variations over the lifetime of the luminaire 200.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. Therefore, the spirit and scope of the invention should not be limited to the versions described above.

We claim:

1. A solid state lighting (SSL) luminaire, comprising:
   a first plurality of light emitting diodes (LEDs);
   a second plurality of light emitting diodes emitting light with characteristics different from the first plurality of LEDs; and
   a current control mechanism configured to control the intensity of light from said first and second pluralities of LEDs, said current control mechanism capable of separately and disproportionately changing the emission intensity of said first and second pluralities of LEDs, such that said SSL luminaire emits light having desired characteristics;
wherein said first and second pluralities of LEDs can be turned off by said current control mechanism;
wherein one of said first or second pluralities of LEDs has higher emission efficiency than the other; and
wherein said current control mechanism can turn off the one of said first and second pluralities of LEDs with lower emission efficiency.

2. The SSL luminaire of claim 1, wherein said current control mechanism can turn off one of said first and second pluralities of LEDs and said luminaire emits light compatible with night time lighting operation.

3. The SSL luminaire of claim 1, wherein said first plurality of LEDs comprises blue shifted yellow (BSY) LEDs and said second pluralities of LEDs comprises red emitting LEDs.

4. The SSL luminaire of claim 3, wherein said current control mechanism can turn off said plurality of BSY LEDs for night time lighting operation.

5. The SSL luminaire of claim 1, further comprising a third plurality of LEDs having different emission characteristics from said first and second pluralities of LEDs, wherein said current control mechanism control the intensity of light from said third plurality of LEDs, said current control mechanism capable of changing the emission intensity of said first, second and third pluralities of LEDs so that said SSL luminaire emits light having desired characteristics.

6. A solid state lighting (SSL) luminaire, comprising:
a first plurality of light emitting diodes (LEDs);
a second plurality of LEDs emitting light with characteristics different from the first plurality of LEDs; and
a current control mechanism configured to control the intensity of light from said first and second pluralities of LEDs, said current control mechanism capable of separately changing the emission intensity of said first and second pluralities of LEDs, such that said SSL luminaire emits light having desired characteristics,
wherein said first plurality of LEDs comprises blue shifted yellow (BSY) LEDs and said second plurality of LEDs comprises red emitting LEDs,
wherein said BSY LEDs emit light more efficiently than said red LEDs and wherein said current control mechanism can turn off said red LEDs for high efficiency lighting operation.

7. A solid state lighting (SSL) luminaire, comprising:
a first plurality of light emitting diodes (LEDs);
a second plurality of light emitting diodes emitting light with characteristics different from the first plurality of LEDs; and
a current control mechanism configured to control the intensity of light from said first and second pluralities of LEDs, said current control mechanism capable of separately changing the emission intensity of said first and second pluralities of LEDs, such that said SSL luminaire emits light having desired characteristics,
wherein said current control mechanism controls the intensity of said first and second pluralities of LEDs during dimming of said SSL luminaire such that said first plurality of LEDs are disproportionally dimmed compared to said second plurality of LEDs.

8. A solid state lighting (SSL) luminaire, comprising:
a plurality of first light emitting diodes (LEDs);
a plurality of second light emitting diodes emitting light with characteristics different from the first LEDs; and
a current control mechanism configured to control the intensity of light from said first and second pluralities of LEDs, said current control mechanism capable of separately changing the emission intensity of said first and second pluralities of LEDs, such that said SSL luminaire emits light having desired characteristics,
wherein said current control mechanism varies the emission of said first and second pluralities of LEDs so that the emission from said SSL luminaire is on a point on a CIE diagram tie line between the emission points for said first and second pluralities of LEDs.

9. A solid state lighting (SSL) luminaire, comprising:
a first plurality of light emitting diodes (LEDs);
a second plurality of light emitting diodes emitting light with characteristics different from the first plurality of LEDs; and
a current control mechanism configured to control the intensity of light from said first and second pluralities of LEDs, said current control mechanism capable of separately changing the emission intensity of said first and second pluralities of LEDs, such that said SSL luminaire emits light having desired characteristics,
wherein said current control mechanism controls the intensity of said first and second pluralities of LEDs during dimming of said SSL luminaire such that said first plurality of LEDs are disproportionally dimmed compared to said second plurality of LEDs,
wherein said current control mechanism controls the intensity of said first and second pluralities of LEDs during dimming of said SSL luminaire such that said SSL luminaire mimics dimming of incandescent based lighting fixtures.

10. The SSL luminaire of claim 9, wherein said first plurality of LEDs comprises BSY LEDs and said second plurality of LEDs comprises red LEDs; and
wherein said second plurality of LEDs is dimmed less than said first plurality of LEDs.

11. The SSL luminaire of claim 9, wherein said second plurality of LEDs comprises red LEDs; and
wherein said second plurality of LEDs is dimmed less than said first plurality of LEDs.

12. A solid state lighting (SSL) luminaire, comprising:
a first plurality of blue shifted yellow (BSY) light emitting diodes (LEDs);
a second plurality of BSY LEDs emitting light with different characteristics than said first plurality of BSY LEDs; and
a third plurality of red LEDs, wherein the relative emission intensities of the first, second and third pluralities of LEDs can be separately varied at different rates when adjusting the intensity of light of the SSL luminaire, such that said SSL luminaire emits a combination of light from said first, second and third pluralities of LEDs with desired lighting characteristics.

13. The SSL luminaire of claim 12, wherein the light from said first, second and third pluralities of LEDs combines to produce white light.

14. The SSL luminaire of claim 12, wherein the emission of one or more of said first, second and third pluralities of LEDs can be turned off.

15. The SSL luminaire of claim 14, wherein the emission of said first, second and third pluralities of LEDs can be turned off manually.

16. The SSL luminaire of claim 14, where the emission of said first, second and third pluralities of LEDs can be turned off automatically in response to changing light conditions.

17. The SSL luminaire of claim 12, wherein the first and second pluralities of LEDs can be turned off for a night time SSL luminaire operation.

18. A solid state lighting (SSL) luminaire, comprising:
a first plurality of blue shifted yellow (BSY) light emitting diodes (LEDs);
a second plurality of BSY LEDs emitting light with different characteristics than said first BSY LEDs; and
a third plurality of LEDs which is red, wherein the relative emission intensities of the first, second and third pluralities of LEDs can be separately varied when adjusting the intensity of light of the SSL luminaire, such that said SSL luminaire emits a combination of light from said first, second and third pluralities of LEDs with desired lighting characteristics,
wherein one of said first and second pluralities of LEDs emits light more efficiently that the other, wherein said third plurality of LEDs and the least efficient ones of said first and second pluralities of LEDs are turned off for high efficiency SSL luminaire operation.

19. A solid state lighting (SSL) luminaire, comprising:
a first plurality of blue shifted yellow (BSY) light emitting diodes (LEDs);
a second plurality of BSY LEDs emitting light with different characteristics than said first BSY LEDs; and
a third plurality of LEDs which is red, wherein the relative emission intensities of the first, second and third pluralities of LEDs can be separately varied when adjusting the intensity of light of the SSL luminaire, such that said SSL luminaire emits a combination of light from said first, second and third pluralities of LEDs with desired lighting characteristics,
wherein the intensity of said first, second and third pluralities of LEDs reduces disproportionately during dimming of said SSL luminaire.

20. A solid state lighting (SSL) luminaire, comprising:
a first plurality of blue shifted yellow (BSY) light emitting diodes (LEDs);
a second plurality of BSY LEDs emitting light with different characteristics than said first plurality of BSY LEDs; and
a third plurality of LEDs which is red, wherein the relative emission intensities of the first, second and third pluralities of LEDs can be separately varied when adjusting the intensity of light of the SSL luminaire, such that said SSL luminaire emits a combination of light from said first, second and third pluralities LEDs with desired lighting characteristics,
wherein the intensity of said first, second and third pluralities of LEDs reduces disproportionately during dimming of said SSL luminaire,
mimicking the dimming of an incandescent based light.

21. A solid state lighting (SSL) luminaire, comprising:
a first plurality of serially connected light emitting diodes (LEDs);
a second plurality of serially connected LEDs; and
a third plurality of serially connected LEDs, said first, second and third pluralities of LEDs having different emission characteristics and capable of emitting a range of emission intensities, wherein the relative emission intensities of the first, second and third pluralities of LEDs can be varied disproportionately such that said SSL luminaire can be controlled to emit light with different lighting characteristics.

22. The SSL luminaire of claim 21, wherein the light from said first, second and third pluralities of LEDs combines to produce white light.

23. The SSL luminaire of claim 21, wherein the emission of one or more of said first, second and third pluralities of LEDs can be turned off.

24. A solid state lighting (SSL) luminaire, comprising:
a first plurality of serially connected light emitting diodes (LEDs);
a second plurality of serially connected LEDs; and
a third plurality of serially connected LEDs, said first, second and third pluralities of LEDs having different emission characteristics, wherein the relative emission intensities of the first, second and third pluralities of LEDs can be varied such that said SSL luminaire can be controlled to emit light with different lighting characteristics,
wherein the emission of said first, second or third pluralities of LEDs can be turned off manually.

25. The SSL luminaire of claim 21, where the emission of said first, second and third pluralities of LEDs can be turned off automatically in response to changing light conditions.

26. The SSL luminaire of claim 21, wherein one of said first, second and third pluralities of LEDs comprises LEDs compatible with night time operation.

27. The SSL luminaire of claim 21, wherein said one of said first, second and third pluralities of LEDs emits light more efficiently than the others.

28. A solid state lighting (SSL) luminaire, comprising:
a first plurality of serially connected light emitting diodes (LEDs);
a second plurality of serially connected LEDs; and
a third plurality of serially connected LEDs, said first, second and third pluralities of LEDs having different emission characteristics, wherein the relative emission intensities of the first, second and third pluralities of LEDs can be varied such that said SSL luminaire can be controlled to emit light with different lighting characteristics,
wherein the emission intensity of said first, second and third pluralities of LEDs can be reduced disproportionately during dimming of said SSL luminaire.

29. A solid state lighting (SSL) luminaire, comprising:
a first plurality of serially connected light emitting diodes (LEDs);
a second plurality of serially connected LEDs; and
a third plurality of serially connected LEDs, said first, second and third pluralities of LEDs having different emission characteristics, wherein the relative emission intensities of the first, second and third pluralities of LEDs can be varied such that said SSL luminaire can be controlled to emit light with different lighting characteristics,
the emission of said first, second and third pluralities of LEDs can be varied so that the emission from said SSL luminaire is on a point on a CIE diagram within a triangle formed by a tie line between the emission points for said first, second and third LEDs.

30. A solid state lighting (SSL) luminaire, comprising:
a first plurality of serially connected light emitting diodes (LEDs);
a second plurality of serially connected LEDs; and
a third plurality of serially connected LEDs, said first, second and third pluralities of LEDs having different emission characteristics, wherein the relative emission intensities of the first, second and third pluralities of LEDs can be varied such that said SSL luminaire can be controlled to emit light with different lighting characteristics,
wherein the emission of said first, second and third pluralities of LEDs can be varied so that the emission from said SSL luminaire is on a point on a CIE diagram within a triangle formed by a tie line between the emission points for said first, second and third pluralities of LEDs, wherein the emission of said first, second and third pluralities of LEDs is varied automatically in response to changing lighting conditions.

31. A solid state lighting (SSL) luminaire, comprising:
a first plurality of light emitting diodes (LEDs); and
a second plurality of LEDs emitting light with characteristics different from the first plurality of LEDs, wherein the intensity of light from said first and second pluralities of LEDs can be separately controlled at different rates so that said SSL luminaire produces a dominant emission from one of said first and second pluralities of LEDs in response to changing lighting conditions;
wherein said first plurality of LEDs and said plurality of second LEDs can emit a range of emission intensities.

32. The SSL luminaire of claim 31, further comprising a third plurality of LEDs having emission characteristics different from said first and second pluralities of LEDs, the emission of said third plurality of LEDs controlled so that said SSL luminaire produces a dominant emission from said first, second and third pluralities of LEDs in response to changing lighting conditions.

33. A solid state lighting (SSL) luminaire, comprising:
a first plurality of red light emitting diodes (LEDs);
a second plurality of LEDs emitting light with characteristics different from the first plurality of LEDs; and
a current control mechanism configured to control the intensity of light from said first and second pluralities of LEDs, said current control mechanism capable of separately and disproportionately changing the emission intensity of said first and second pluralities of LEDs, such that said SSL luminaire emits light having desired characteristics;
wherein said current control mechanism can turn off said second plurality of LEDs.

34. The SSL luminaire of claim 33, wherein said second plurality of light emitting diodes comprises blue shifted yellow (BSY) LEDs.

35. The SSL luminaire of claim 33, wherein said current control mechanism can lower the emission intensity of said second plurality of LEDs more than the emission intensity of said first plurality of LEDs.

36. The SSL luminaire of claim 33, wherein said current control mechanism controls the intensity of said first and second pluralities of LEDs during dimming of said SSL luminaire such that said SSL luminaire mimics dimming of incandescent based lighting fixtures.

37. The SSL luminaire of claim 33, wherein said first and second pluralities of LEDs combine to produce white light.

38. The SSL luminaire of claim 33, wherein the emission of said first plurality of LEDs can be turned off.

* * * * *